(12) United States Patent
Cheng et al.

(10) Patent No.: US 8,084,193 B2
(45) Date of Patent: Dec. 27, 2011

(54) SELF-SEGREGATING MULTILAYER IMAGING STACK WITH BUILT-IN ANTIREFLECTIVE PROPERTIES

(75) Inventors: Joy Cheng, San Jose, CA (US); Dario L Goldfarb, Mohegan Lake, NY (US); David R Medeiros, West Stockbridge, MA (US); Daniel P Sanders, San Jose, CA (US); Dirk Pfeifer, Croton on Hudson, NY (US); Libor Vylicky, Croton on Huson, NY (US)

(73) Assignee: International Business Machines Corporation, Armonk, NY (US)

( * ) Notice: Subject to any disclaimer, the term of this patent is extended or adjusted under 35 U.S.C. 154(b) by 314 days.

(21) Appl. No.: 12/172,233

(22) Filed: Jul. 12, 2008

(65) Prior Publication Data
US 2010/0009132 A1    Jan. 14, 2010

(51) Int. Cl.
*G03F 7/30* (2006.01)
*G03F 7/11* (2006.01)
(52) U.S. Cl. ..... 430/326; 430/325; 430/327; 430/272.1; 430/271.1; 430/273.1; 430/311; 430/935; 438/952
(58) Field of Classification Search .................. None
See application file for complete search history.

(56) References Cited

U.S. PATENT DOCUMENTS
5,693,691 A    12/1997  Flaim et al. ............. 523/436
(Continued)

FOREIGN PATENT DOCUMENTS
WO    WO-03/044079 A1 *  5/2003

OTHER PUBLICATIONS

Baney et al, Silsesquioxanes, Chem.Rev. American Chemixal Society,. 1995 vol. 95, pp. 1409-1430.*

(Continued)

*Primary Examiner* — Cynthia Hamilton
(74) *Attorney, Agent, or Firm* — Robert J. Eichelburg; The Law Offices of Robert J. Eichelburg

(57) ABSTRACT

A coating process comprises forming a patterned material layer on a substrate using a self-segregating polymeric composition comprising a polymeric photoresistive material and an antireflective coating material. The polymeric photoresistive material and the antireflective coating material that make up the self segregating composition are contained in a single solution. When depositing this solution on a substrate and removing the solvent, the two materials self-segregate into two layers. The substrate can comprise one of a ceramic, dielectric, metal, or semiconductor material and in some instances a material such as a BARC material that is not from the self segregating composition. The composition may also contain a radiation-sensitive acid generator and a base quencher. This produces a coated substrate having a uniaxial bilayer coating oriented in a direction orthogonal to the substrate with a top photoresistive coating layer and a bottom antireflective coating layer. The process may also include optionally coating a top coat material on the coated substrate. Pattern-wise exposing the coated substrate to imaging radiation and contacting the coated substrate with a developer, produces the patterned material layer wherein the optional top coat material and a portion of the photoresist layer are simultaneously removed from the coated substrate, thereby forming a patterned photoresist layer on the substrate. Alternatively, the optional top coat material, a portion of the photoresist layer and a portion of the bottom antireflective layers are simultaneously removed from the coated substrate by the developer, thereby forming a patterned photoresist layer on the substrate.

3 Claims, 2 Drawing Sheets

U.S. PATENT DOCUMENTS

| | | | | |
|---|---|---|---|---|
| 6,010,829 A * | 1/2000 | Rogers et al. | | 430/316 |
| 6,916,594 B2 | 7/2005 | Bok et al. | | 430/270.1 |
| 7,241,707 B2 * | 7/2007 | Meagley et al. | | 430/311 |
| 2001/0018160 A1 * | 8/2001 | Ueda et al. | | 430/190 |
| 2003/0010748 A1 | 1/2003 | Kodama et al. | | 216/41 |
| 2003/0099897 A1 * | 5/2003 | Fedynyshyn | | 430/192 |
| 2006/0093959 A1 * | 5/2006 | Huang et al. | | 430/270.1 |
| 2006/0134546 A1 | 6/2006 | Huang et al. | | 430/270.1 |
| 2006/0183348 A1 * | 8/2006 | Meagley et al. | | 438/789 |
| 2006/0188804 A1 | 8/2006 | Allen et al. | | 430/270.1 |
| 2006/0275697 A1 * | 12/2006 | Hata et al. | | 430/270.1 |
| 2007/0015082 A1 | 1/2007 | Angelopoulos et al. | | 430/270.1 |
| 2007/0015083 A1 | 1/2007 | Babich et al. | | 430/270.1 |
| 2007/0196748 A1 | 8/2007 | Angelopoulos et al. | | 430/270.1 |
| 2007/0254235 A1 | 11/2007 | Allen et al. | | 430/270.1 |
| 2007/0254237 A1 | 11/2007 | Allen et al. | | 430/270.1 |
| 2008/0008955 A1 | 1/2008 | Brodsky et al. | | 430/270.1 |
| 2008/0008965 A1 | 1/2008 | Ohashi et al. | | 430/280.1 |

OTHER PUBLICATIONS

WO/2003/044079 Baldwin, et al.SpI9n-On Glass Anti-Reflective Coatings for Photolithography, Published May 3, 2003.

*Chem 421: Introduction to Polymer Chemistry: The Chemistry of Photoresists* http://chem.chem.rochester.edu/~chem421/polymod2.htm.

* cited by examiner

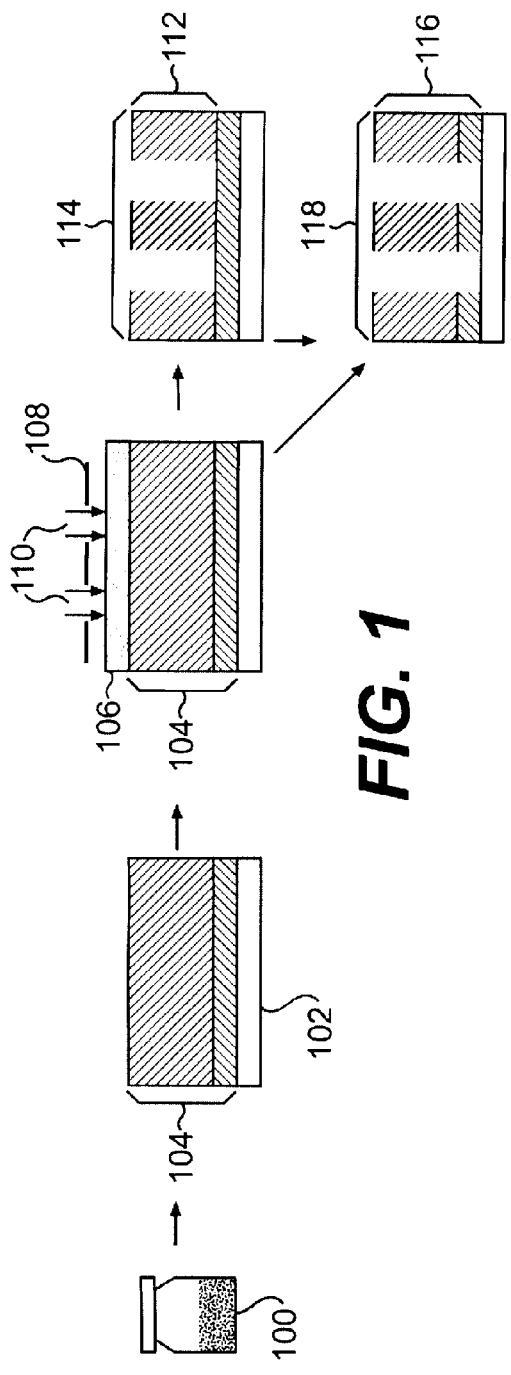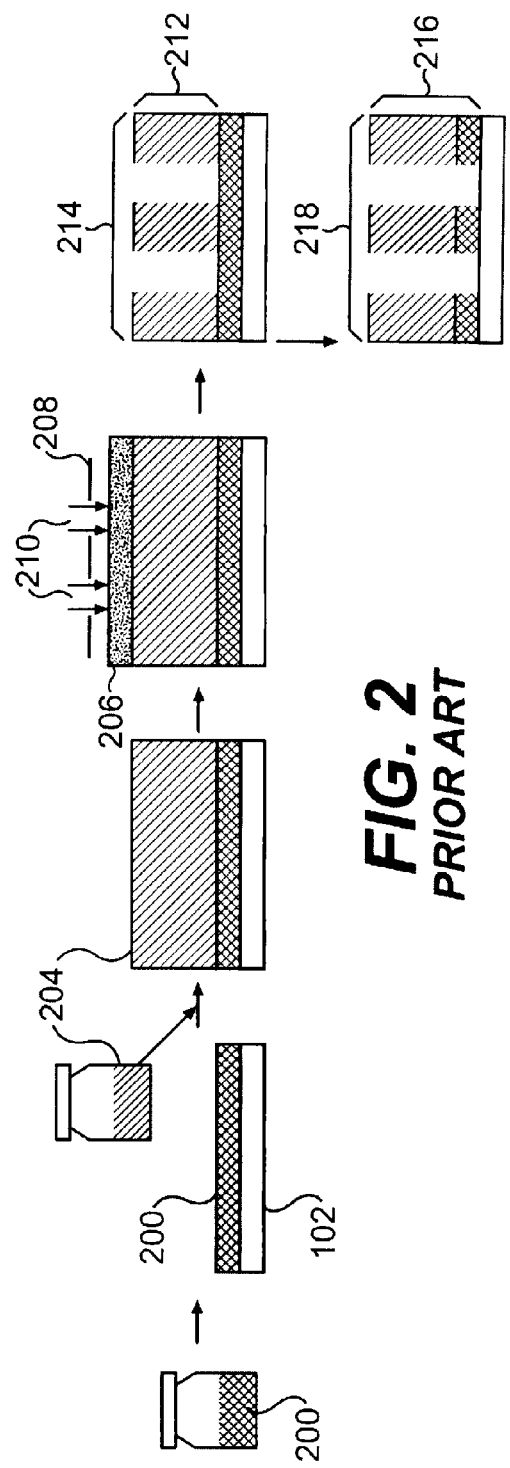

SELF-SEGREGATING MULTILAYER IMAGING STACK WITH BUILT-IN ANTIREFLECTIVE PROPERTIES

FIELD OF THE INVENTION

The present invention relates to the fields of deep ultraviolet (DUV) photolithography and semiconductor fabrication. More specifically, the invention relates to a processing scheme for a spin-castable, or spin-on, or spin-coating multi-component organic formulation with a reduced number of processing steps wherein the individual polymeric materials composing the formulation have the ability to vertically segregate during the coating and/or annealing steps to form a multilayer imaging stack.

BACKGROUND OF THE INVENTION AND RELATED ART

The constant demand for shrinking device sizes by the semiconductor industry requires continuous improvement in resolving power in state-of-the-art lithography tools. For example, immersion lithography has arisen as an effective enhancement technique to extend the resolution limits of optical lithography, and is expected to enable manufacturing of highly integrated circuits at the 45 nm node in 2008. Resolution requirements at the 32 nm node will require even more advanced lithographic solutions due to smaller device dimensions compared to previous nodes. One of the potential techniques to overcome the optical resolution limit of 193 nm scanners at the 32 nm node is "double exposure," where the total aerial image is sub-divided into two independent exposure passes having relaxed spatial resolution requirements. These two images are added sequentially to achieve the desired final pattern geometry. Such approach encompasses doubling the number of all photomasks used for "double exposure"' as well as doubling processing time, tool time and materials usage, resulting in increased cost. If adopted, this particular technology solution is expected to be applied to multiple levels resulting in a significant increase in cost of ownership (COO). Therefore, methods that can compensate this potentially elevated COO such as more efficient wafer processing (reduced cycle times, reduction in the total number of processing steps, reduction in volume of raw materials used) would partially compensate for the aforementioned higher manufacturing costs associated with future lithographic nodes.

One additional requirement for patterning schemes targeted at advanced lithographic nodes is the need to sustain resolution, CD control and etch selectivity. One way to achieve this comprises multiple pattern transfers into highly etch selective films, such as in a trilayer patterning scheme (S. Burns et al., "Trilayer Development for 193 nm Immersion Lithography," J. Photopolymer Sci. Tech., 2007, Vol. 20, No. 5, p. 679). One example of a trilayer system involves coating a thick planarizing underlayer followed by the application of separate etch-resistant (e.g. spin-on silicon-containing Bottom Anti-Reflective Coating or BARC) and imaging (resist) layers. When the BARC typically is a partially or completely opaque material, it has the imaginary part of complex refractive index, k, above about 0.1. The typical k photoresist, on the other hand, is usually below about 0.1 (the imaginary part of complex refractive index, k) which we define as partially or completely transparent. In some instances, the imaginary part of complex refractive index, k can comprise about 0.1 for the BARC or the photoresist. In any event in one embodiment of the invention, the BARC typically is partially or completely opaque and the photoresist is partially or completely transparent. Some of the critical advantages of trilayer lithography include large etch selectivity with the underlying substrate, the ability to use conventional chemically amplified resists, good planarization of the wafer topology, and good reflectivity control of the stack (M. Slezak et al., Semiconductor International, Feb. 1, 2007). One of the disadvantages of using a trilayer stack is the longer processing time and increased number of processing steps, which results in a more complex integration path.

At the same time, patterning arbitrary structures using projection-reduction optical systems requires the incorporation of reflectivity control techniques to decrease the unwanted reflection of DUV radiation (DUV comprising light having wavelengths of 193 nm or 248 nm) at the top and bottom surfaces of the imaging layer.

Reflection of light from the substrate/resist interface produces variations in the light intensity and scattering in the resist during exposure, resulting in non-uniform photoresist line width upon development. Light can scatter from the interface into regions of the resist where exposure was not intended, resulting in line width variations. The amount of scattering and reflection will typically vary from region to region resulting in line width non-uniformity.

To eliminate the effects of chromatic aberration in exposure equipment lenses, monochromatic or quasi-monochromatic light are commonly used in resist projection techniques. Unfortunately, due to resist/substrate interface reflections, constructive and destructive interference is particularly significant when monochromatic or quasi-monochromatic light is used for photoresist exposure. In such cases the reflected light interferes with the incident light to form standing waves within the resist. In the case of highly reflective substrate regions, the problem is exacerbated since large amplitude standing waves create thin layers of underexposed resist at the wave minima. If the resist thickness is non-uniform, the problem becomes more severe, resulting in variable line width control.

Top anti-reflective coat (TARC) materials can prevent the multiple interference of light that takes place within the photoresist layer during exposure. However, a TARC does not reduce the notching problem that comes from the presence of topography under the photoresist layer. Instead, a BARC formed beneath the photoresist layer is capable of eliminating both swing and notching problems, and has emerged as the most effective reflectivity solution while interfering the least with the lithographic process.

Therefore, methods that can reduce the increasing number of processing steps without sacrificing the number of layers utilized in the imaging stack that are present for good reflectivity control and image transfer are required to reduce cycle time and volume of chemical used in semiconductor fabs.

In addition to the above problems associated with the critical lithography levels (levels requiring the highest imaging resolution) there are many levels that do not require high resolution imaging but cannot use the standard imaging stack comprised of resist on BARC. One such example is that of implant levels where dry-etch (plasma) transfer of the resist image into the substrate (or BARC) is not possible due to plasma damage and contamination of the substrate. Therefore imaging also becomes challenging due to poor reflectivity control.

The related art describes various methods, compositions, processes and articles of manufacture in the field of devices produced by photolithographic means. For example, Brodsky et al. United States Patent Publication No. 20080008955 describe a graded spin-on organic antireflective coating for photolithography comprising at least two polymer components in a single formulation that substantially segregate between a first substrate interface and a second photoresist interface.

Allen et al. United States Patent Publication No. 20070254237 describe a topcoat material and use thereof in immersion lithography processes.

Angelopoulos et al. United States Patent Publication No. 20070196748 describe a process of making a semiconductor device using multiple antireflective materials.

Angelopoulos et al. United States Patent Publication No. 20070015082 describe a process of making a lithographic structure using antireflective materials.

Babich et al. United States Patent Publication No. 20070015083 describe an antireflective composition and process of making a lithographic structure.

Allen et al. United States Patent Publication No. 20060188804 describe immersion topcoat materials with improved performance for application on top of a photoresist.

Allen et al. United States Patent Publication No. 20070254235 describe a self-topcoating resist for photolithography comprising a resist additive which is a compound comprising a polymer in a resist composition comprising a photoresist polymer, a photoacid generator and a solvent. The additive rises to the surface of the resist composition thereby inhibiting the leaching of unwanted material into an immersion fluid used with the composition in immersion lithography conditions.

Huang et al. United States Patent Publication No. 20060134546 describe low refractive index polymers as an underlayer for silicon-containing photoresists that exhibit high etch resistance and improved optical properties.

Baldwin et al. WO2003044079 describe spin-on-glass anti-reflective coatings for photolithography, noting that organic anti-reflective coatings (ARCS) share many chemical properties with organic photoresist that limit useable process sequences in that that ARCs may intermix with photoresist layers Baldwin et al. propose one solution to avoid intermixing by introducing thermosetting binders as additional components of ARCs. These consist of the binders taught by Flaim et al., U.S. Pat. No. 5,693,691.

Okeda et al. et al., United States Patent Publication No. 20070146887, paragraphs [0309], [0549], [0557], and [0688] to [0716] describe various mixtures of compounds and compositions in antireflection films used in the manufacture of liquid crystal displays.

SUMMARY OF THE INVENTION

The present invention comprises processes and compositions that address these needs and not only provides advantages over the related art, but also substantially obviates the foregoing and other limitations and disadvantages of the related art. The written description, claims, abstract of the disclosure that follow, and appended drawings set forth various features, objectives and advantages of the invention and how they may be realized and obtained which will also become apparent by practicing the invention.

In another aspect, the invention comprises a method of forming a patterned material layer on a substrate comprising providing a substrate and forming a layer of a self-segregating polymeric composition on the substrate. The self-segregating polymeric composition comprises (i) a polymeric photoresistive material comprising a positive working photoresist or a negative working photoresist, (ii) a polymeric BARC material, (iii) an optional radiation-sensitive acid generator and, (iv) an optional base quencher, to form a coated substrate comprising a uniaxial bilayer polymer coating on and substantially parallel to the substrate. The uniaxial bilayer polymer coating undergoes a phase separation that is oriented in a direction orthogonal to the substrate, the coated substrate thereby including a top photoresistive coating layer and a bottom antireflective coating layer.

Optionally, the process comprises forming a layer comprising a top coat material on the uniaxial bilayer, patternwise exposing the coated substrate to imaging radiation to form a patterned area comprising exposed areas and unexposed areas, and optionally an area not covered by a pattern. Baking the exposed substrate is an optional step. The coated substrate is then contacted with a developer.

The antireflective coating comprises a silicon polymer having the general structure:

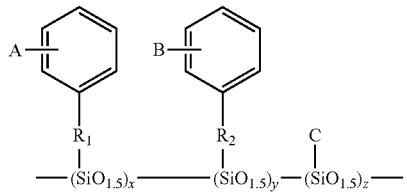

where $(SiO_{1.5})$ comprises a polysilsesquioxane polymer backbone, $R_1$ and $R_2$ independently comprise a linear, branched, or cyclic alkylene group of 1 to about 10 carbons, A is either hydrogen, methoxy-, ethoxy- or other alkoxy-, halogen or an ester group, B is hydroxy-, carboxy- or a carboxamido- group and is independently located in the 2-, 3- or 4-positions of the benzene ring, C is a nonaromatic moiety comprising:

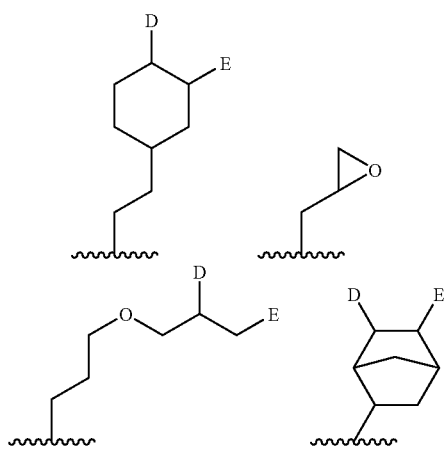

where D and E independently are hydrogen, hydroxy-, acetoxy- groups, alkylalkoxy- or alkylacetoxy- groups or D and E can form a cyclic epoxide, the molar fractions x, y and z independently represent a value from 0 to about 0.8 and the sum of x, y and z equals 1; or wherein the antireflective coating comprises an amide polymer having a general structure:

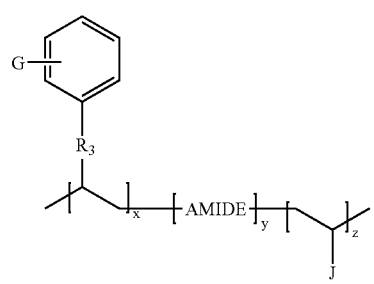

where $R_3$ is a linear, branched, or cyclic alkylene group of 1 to about 10 carbons, G is hydrogen, hydroxy-, acetoxy-, methoxy-, ethoxy- or other alkoxy-, halogen, ester, carboxy- or a carboxamido- group, J is alkyl, alkoxy-, or up to about 6 carbon atom carboalkoxy or alkoxycarbonyl esters, lactone or anhydride moieties, the molar fractions x, y and z independently are from 0 to about 0.5 and the sum of x, y and z equals 1, and the amide group is an organic amidic group:

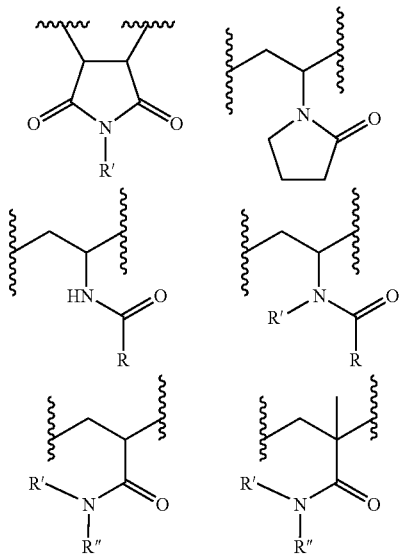

where R can be methyl, ethyl, phenyl or vinyl and R' and R" can be independently hydrogen, alkyl, or an aryl group.

In one aspect, the thrust of this invention comprises a spin-on blend of two or more polymeric components formulated in an organic solvent. The multiple components present in the spin-on formulation phase-separate vertically during the spin-casting process to form a multilayer imaging stack. These phase-separated layers consist of a top self-segregated resist layer and a bottom ARC layer. Due to the limited intermiscibility of the materials comprising the blend, the boundary between the layers of segregated components can be either very sharp or diffuse (graded). In case of the sharp boundary, the high coherence between layers is comparable to conventional processes where the individual layers are deposited sequentially. However, for some applications it may be more beneficial to utilize the case of gradual layer boundary where the transition from one material to the other is not as abrupt. One such example can be an imaging stack with improved reflectivity control. Brodsky et al. United States Patent Application US20080008955, describe some of the advantages of using a graded layer system.

The self-segregating nature of the materials and formulation described in the present invention reduces the number of processing steps that are required to form a multilayer imaging stack, as well as the volume of chemicals needed for such purpose compared to conventional lithographic materials and processes. It also provides a method of adding reflectivity control to imaging applications that traditionally suffer from the lack of one.

BRIEF DESCRIPTION OF THE DRAWINGS

The accompanying Figures, incorporated into this specification, together with the detailed description herein serve to further illustrate various embodiments and to explain various principles and advantages of the present invention.

FIG. 1 illustrates a processing sequence using a self-segregating Resist/BARC imaging system.

FIG. 2 illustrates a processing sequence using a conventional imaging system, i.e., a conventional multilayer imaging stack deposition method and processing by a sequential combination of coat/bake steps.

DETAILED DESCRIPTION OF THE INVENTION

Figure 3:
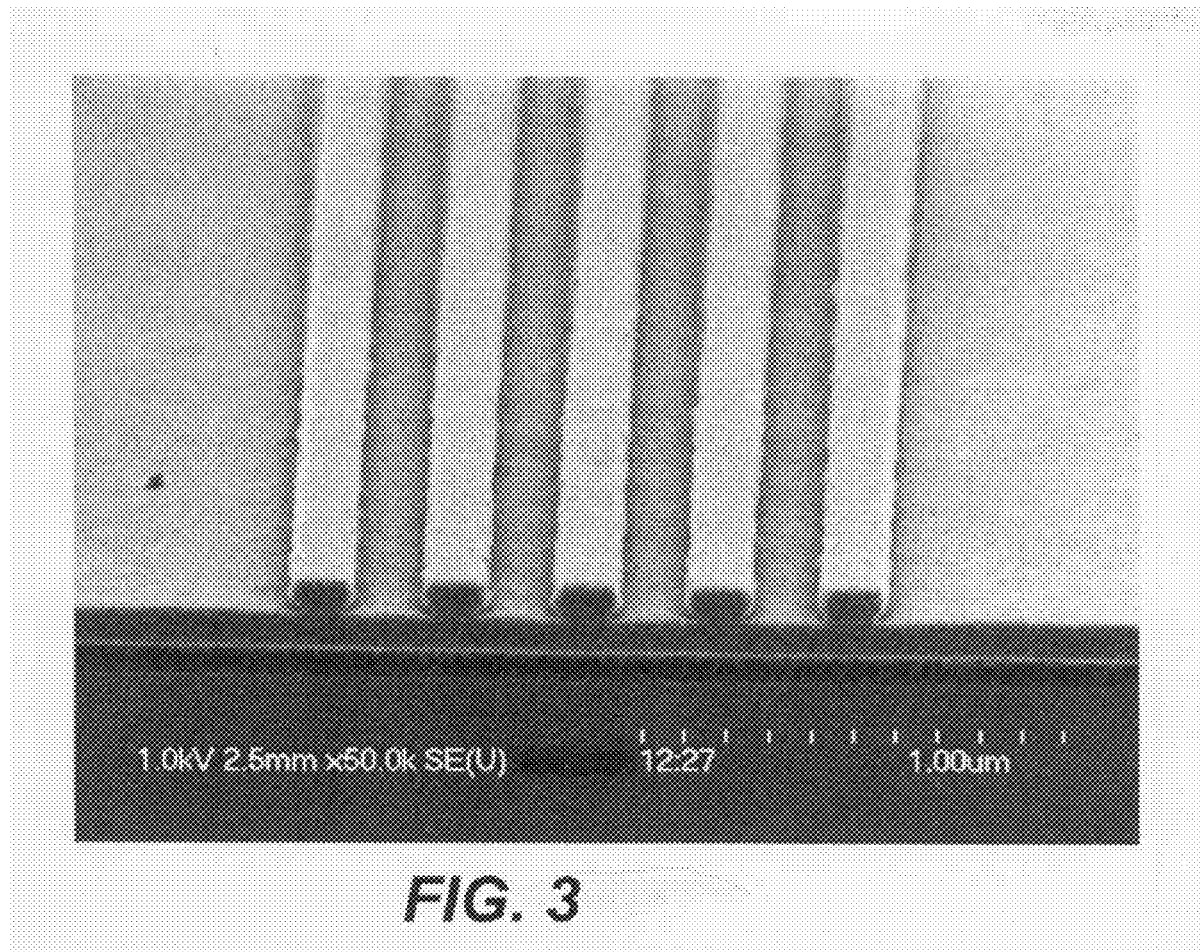
FIG. 3 comprises a SEM image of a resist pattern printed using the method and materials of Example 2 of the present invention.

The invention, in one aspect comprises a method of forming a patterned material layer comprising coating a substrate, with a single self-segregating polymeric formulation comprising both, a polymeric photoresistive material and an antireflective coating material. This composition may also contain a radiation-sensitive acid generator and a base quencher. This method produces a coated substrate having a uniaxial bilayer coating oriented in a direction orthogonal to the substrate with a top photoresistive coating layer and a bottom antireflective coating layer. The method may also include optionally forming a top coat material layer onto the coated substrate. The coated substrate is exposed pattern-wise to imaging radiation and, optionally, subjected to a post-exposure bake. The coated substrate is subsequently contacted with a developer, wherein the optional top coat material and a portion of the photoresist layer are simultaneously removed from the coated substrate, thereby forming a patterned photoresist layer on the anti-reflective material layer. Alternatively, in addition to removing the optional top coat material and a portion of the photoresist layer during the develop step, a portion of the bottom antireflective layer can be simultaneously removed from the coated substrate as well thereby forming a patterned photoresist/BARC layer on the material layer. The polymeric photoresistive materials in combination with these antireflective coating materials comprise the self-segregating coating compositions.

The polymers employed in the self-segregating imaging formulation are selected in such a way that preferential segregation of one or more components towards the top (air/polymer) or bottom (polymer/substrate) interfaces occurs during the film casting and/or film baking process. In polymer blends, differences in interfacial energies, which reflect a preferential interaction, generally cause one polymer to segregate to the substrate or air interface. For polymer blend constituents having different hydrophobicity or surface tension, the more hydrophilic or higher surface tension species will typically wet a polar substrate surface during the coating or baking process. Even slight differences in atomic polarizability between polymer chains, such as in the case of hydrogenated polystyrene/deuterated polystyrene (H vs. D), can induce a surface energy mismatch and lead to preferential wetting of the blend/air interface (R. A. L. Jones et al. Phys. Rev. Lett. 62, 1989, p. 280). Preferential wetting of the blend/substrate interface by one of the blend constituents may also occur, based on analogous interfacial energy arguments (D. A. Winesett et al., Polym. Internat. 49, 2000, p. 458). Conversely hydrogen-bonding interactions between polymer components can reduce the extent of interfacial segregation (Y. Duan et al., Macromolecules 34, 2001, p. 6761).

The self-segregating multilayer imaging stacks of the present invention are characterized by the presence of more than one polymer component forming an isotropic mixture in a solvent. During the coating and film forming process, those components do not necessarily need to remain thermodynamically miscible and they self-assemble into a vertically segregated multilayer stack. By vertical phase segregation it is understood that each polymeric component forms a separate material layer that is parallel to the substrate surface as depicted in FIG. 1. The low entropy of mixing of the blend constituents, which typically forces the free energy of mixing to adopt a positive value, guides the polymer blend to separate in physically distinct and immiscible phases. Polymer phase separation that occurs perpendicularly to the substrate plane combined with preferential substrate wetting by one component can lead to chemically and optically distinctive layers that are free of detectable surface defects and are suitable for high resolution lithography patterning.

On the contrary, when lateral phase separation is verified, as in the case of partially miscible polymers coated on a neutral substrate surface, defects in the form of islands, craters, protrusions, roughness, comets, marks, satellite spots, and the like can be formed during the simultaneous polymer demixing and coating process, rendering films having no practical use in the field of lithographic patterning for semiconductor manufacturing.

The materials that can be used to practice the present invention do not have to be substantially different from those used in conventional photoresist and antireflective coating technology. Blend combinations of silicon-containing photoresist with organic BARCs, as in the case of bilayer resists, or organic resist with silicon-containing BARC, as in the case of SiARCs and trilayer resists systems are possible. Khojasteh, et al., U.S. Pat. No. 6,770,419 and references cited therein describe materials suitable for use in bilayer systems. Iwabuchi, et al., United States Patent Publication No. US2005/0277058 describe materials suitable for use in trilayer applications. Khojasteh, et al., U.S. Pat. No. 7,326,523 and references cited therein describe materials suitable for use as underlayers for silicon-containing materials.

In the present invention a self-segregated multilayer imaging stack with built-in antireflective properties is formed by using a formulation (isotropic solution) composed of at least two polymeric materials that individually carry either bottom antireflective properties or photoresistive characteristics selected for the imaging radiation of choice (193 nm or 248 nm, however shorter or longer wavelengths can also be used). This formulation is dispensed and spin-cast onto a substrate using any of the traditional methods employed to deposit liquid formulations, such as spin-coating.

The substrate might contain underlying topography, such as that encountered in certain functional levels of microelectronic circuits. During the coating process, partial or complete vertical phase-segregation of the material containing bottom antireflective properties towards the bottom surface and the material carrying photoresistive properties towards the air interface is achieved. Post-apply bake of the self-segregated film eventually ensures completion of the vertical phase segregation of the aforementioned materials to the desired level, thus physically defining a top photoresist layer and an underlying antireflecting layer. The self-segregating composition of the present invention can also include additives in variable concentration, such as photoacid generators (PAGs), base quenchers (BQs), surfactants, dissolution inhibitors, and crosslinkers. The distribution of these additives between the top and bottom self-segregated layers comprises a function of their relative solubilities.

In one embodiment, those components remain in the top photoresistive layer. Ohasi et al., United States Patent Publication No. 20080008965, paragraphs [0095] to [0117] describe PAGs. Okeda et al. et al., United States Patent Publication No. 20070146887, paragraphs [0953] to [0959] also describe PAGs. Base quenchers (BQs), surfactants, dissolution inhibitors and crosslinkers are also well known in the art. The PAGs and BQs can be used in concentrations ranging from 0 to about 15% or between 1 to 5%.

The self-segregating composition can be formulated in any organic solvent used for spin-coating of organic layers known to those skilled in the art. Contrary to the case of conventional BARCs used in optical lithography, the bottom antireflective layer of the present invention does not need to be crosslinked during the post-apply baking process, since the photoresist layer and the BARC layer are cast simultaneously with the self-segregating technique. This attribute of the self-segregating stack can be advantageous in those cases where solvent-based stripping is the only viable option for removal of the organic stack after subsequent processing steps, such as in the case where the underlying substrate is sensitive to dry etch processes. Materials that are not cross-linked are more amenable to this process than cross-linked materials. Certain implant level applications comprise one example of this, where the device active area lies immediately beneath the implant resist/BARC stack. Solvent-based strip also is generally faster than dry-etch rework which further results in production time and savings.

The photoresist material used in the self-segregating formulation can be either a chemically amplified (CA) resist or non-CA resist. The photoresist material can be either positive tone or negative tone. Optionally, the self-segregated multilayer stack can be coated with a conventional top coating selected for the imaging radiation of choice (193 nm or 248 nm, however shorter or longer wavelengths are also possible). This coating can be either TARC or immersion topcoat or both as is known in the art. Materials that might be suitable as topcoat layers for immersion lithography can be found in US Patent Publication No. US20060188804A1. The thickness of the self-segregated bottom antireflective coating composition of the present invention may be varied depending on the desired function. For typical applications, the thickness of the self-segregated photoresist layer comprises about 400 to about 10000 Å, more typically about 600 to about 2000 Å, and the thickness of the self-segregated bottom antireflective layer comprises about 200 to about 2000 Å. The compositions of the invention can have etch resistant properties lower, equal to, or higher than those BARC and photoresist materials conventionally used in optical photolithography and known to those skilled in the art.

The compositions comprising the antireflective coating materials of the present invention are especially useful for lithographic processes used in the manufacture of integrated circuits on semiconductor substrates, as well as the other substrates described herein. These compositions are especially useful for lithographic processes using deep-UV radiation such as 193 nm light but can be adapted for use with E-beam, EUV (about 13.5 nm radiation), and 157 and 248 nm radiation.

Semiconductor lithographic applications generally involve transfer of a pattern to a layer on the semiconductor substrate. The substrate may be a metal conductor layer, a ceramic insulator layer, a semiconductor layer, and in some instances a material that is not from the self segregating composition such as a BARC material, or other layer depending on the stage of the manufacturing process and the desired material set for the end product.

The formulation of the present invention is typically applied directly over the layer to be patterned, typically by spin-coating. The composition is then baked to remove solvent, and optionally cured (crosslinked).

Typically, the solvent-containing resist composition is applied by spin-coating or other techniques well known in the art. The substrate with the resist coating is then heated (pre-exposure baked) to remove the solvent and improve the coherence of the resist layer. The thickness of the applied layers can vary depending on the application, but it comprises typical substantially uniform thicknesses so that the resist layer is sufficient to withstand subsequent processing (e.g., reactive ion etching) to transfer the lithographic pattern to the underlying substrate layer. In one embodiment, the pre-exposure bake step is conducted for about 10 seconds to about 15 minutes, or about 15 seconds to about 2 minutes. The pre-exposure bake temperature may vary depending on the glass transition temperature of the topcoat, photoresist and BARC materials, and the characteristics of the phase separation process. Usually, a higher baking temperature will ensure a more efficient vertical phase separation of the self-segregating multilayer stack of the invention.

After solvent removal, the self-segregated multilayer imaging stack is then patternwise-exposed to the desired radiation (e.g., 193 nm ultraviolet radiation). Typically, with wave-like radiation such as 193 nm ultraviolet radiation, the patternwise exposure is conducted through a mask which is projected over the resist layer. For 193 nm UV radiation, the total exposure energy comprises typically about 100 mJ/cm$^2$ or less, or about 50 mJ/cm$^2$, or less (e.g., about 15 to about 30 mJ/cm$^2$).

After the desired patternwise exposure, the self-segregating multilayer stack is typically baked to further complete the typical acid-catalyzed reaction in the chemically amplified resist layer and to enhance the contrast of the exposed pattern. The post-exposure bake is typically conducted at about 60° C. to about 175° C., or about 90° C. to about 160° C., and conducted for about 30 seconds to about 5 minutes.

In one embodiment of the invention, after post-exposure bake, the self-segregating multilayer stack structure with the desired pattern is obtained (developed) by contacting the substrate with an alkaline solution which selectively dissolves the optional topcoat and the areas of a positive working photoresist which were exposed to radiation. By positive working photoresist, as is well known to those skilled in the art, it is understood that portions of the resist exposed to the imaging radiation are subsequently removed typically using a alkaline developer solution as opposed to a negative working photoresist where only the areas that were not exposed to the radiation are removed by a developer.

Typical alkaline solutions (developers) are aqueous solutions comprising tetra alkyl ammonium hydroxide, where the alkyl groups comprise the same or different alkyl groups and further comprise from 1 to about 5 carbon atoms, and include straight chain alkyl groups and branched chain isomers thereof such as isopropyl groups, isobutyl groups and the like. One example comprises tetramethyl ammonium hydroxide. The resulting lithographic structure on the substrate is then typically dried to remove any remaining developer solvent. Kodama et al., United States Patent Publication No. 20030010748, paragraph [0236] describes other art-known developers useful in this regard as well as additional alkaline materials that may be suitable.

In another embodiment of the invention, organic solvent can be used as a developer in place of an alkaline solution. Such solvent is chosen so that only the exposed (in case of positive working) or unexposed (in case of negative working) portions of photoresist and BARC are removed and must be specifically tuned for the particular resist system used. Some examples of suitable solvents can include propyleneglycol monomethyl ether, propyleneglycol monomethyl ether acetate, ethyl lactate, methylpentanol, methylpentanone, cyclohexanone, gamma-butyrolactone and many others.

The pattern from the resist structure may then be transferred to the exposed portions of the layer of antireflective material of the present invention by etching with $CF_4$ or other suitable etchant using techniques and materials known in the art.

After the opening of the layer of antireflective coating of the present invention, the underlying layer to be patterned may then be etched using an etchant appropriate to the underlying layer composition. Where the underlying layer comprises a metal (e.g., Cr) a combination of $Cl_2/O_2$ may be used as a dry etchant. Once the desired pattern transfer has taken place, any remaining resist may be removed using conventional stripping techniques. Thus, the compositions of the present invention and resulting lithographic structures can be used to create patterned material layer structures such as metal wiring lines, holes for contacts or vias, insulation sections (e.g., damascene trenches or shallow trench isolation), trenches for capacitor structures, and the like as might be used in the design of integrated circuit devices. The compositions are especially useful in the context of creating patterned layers of oxides, nitrides or polysilicon.

The composition of present invention, where the BARC layer contains silicon or other elements capable of imparting high oxygen reactive ion etch resistance (e.g. germanium), is also particularly useful in applications analogous to the ones employing the traditional trilayer as is well known to those skilled in the art. Here, the Si-containing material can act as a hard mask providing high etch selectivity between the top resist and bottom planarization layer (i.e., transfer layer or spin-on carbon layer).

Examples of general lithographic processes where the composition of the present invention may be useful are disclosed in U.S. Pat. Nos. 4,855,017; 5,362,663; 5,429,710; 5,562,801; 5,618,751; 5,744,376; 5,801,094; 5,821,469, and 5,948,570. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithographic technique or device structure.

In another embodiment of this invention, the self segregated imaging stack is formed and exposed to patterning radiation as described above, and then developed by a step that dissolves not only the topcoat and the resist layers but also the BARC material therefore eliminating the need for plasma assisted opening of the BARC layer. The resulting structure is dried to remove any traces of solvents and can be used for implantation of ions into the substrate revealed by the development step.

Compositions of the present invention are capable of providing outstanding optical, mechanical and etch selectivity properties while being applicable for use in spin-on application techniques as discussed above. The composition comprises a resist, antireflective material and additional components such as PAG, TAG, crosslinkers or BQ. The resist component of the current invention can be selected from commercially available sources. One such example comprises AM2073 photoresist, manufactured by JSR Corporation.

The self-segregating bottom antireflective material requires careful engineering to provide reflectivity control according to the substrate to be patterned and other processing requirements. In one aspect of the invention, the self-segregating antireflective material comprises a polymer having the general structure:

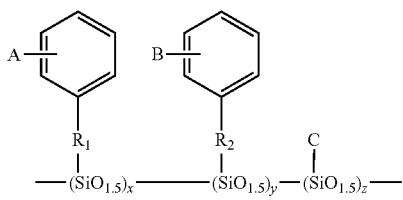

where (SiO$_{1.5}$) comprises a polysilsesquioxane polymer backbone, R$_1$ and R$_2$ independently comprise a linear, branched, or cyclic alkylene group of 1 to about 10 carbons, A comprises either hydrogen, methoxy-, ethoxy- or other alkoxy- having up to about 5 carbon atoms including branched chain and straight chain alkoxy-, halogen or an ester group, B comprises hydroxy-, carboxy- or a carboxamido-group and is independently located in the 2-, 3- or 4-positions of the benzene ring, C comprises a nonaromatic moiety comprising:

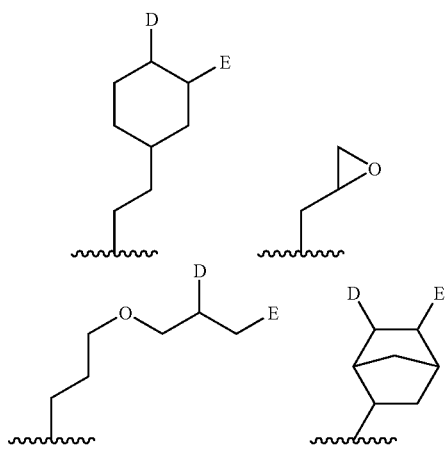

where D and E independently comprise hydrogen, hydroxy-, acetoxy-groups, alkylalkoxy- or alkylacetoxy-groups with each of the alkyl or alkoxy-groups having up to about 5 carbon atoms including branched chain and straight chain alkyl or alkoxy-, D and E can form a cyclic epoxide, the molar fractions x, y and z independently comprise a value from 0 to about 0.8 and the sum of x, y and z equals 1, and wherein the molar fraction x controls the optical density of the antireflective polymer at 193 nm, the molar fraction y controls the dissolution properties of the antireflective polymer in a developer, and molar fraction z is used for fine tuning of the optical dissolution and adhesion properties of the antireflective polymer.

Illustrative examples of such structures comprise:

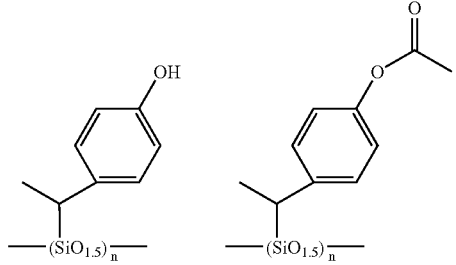

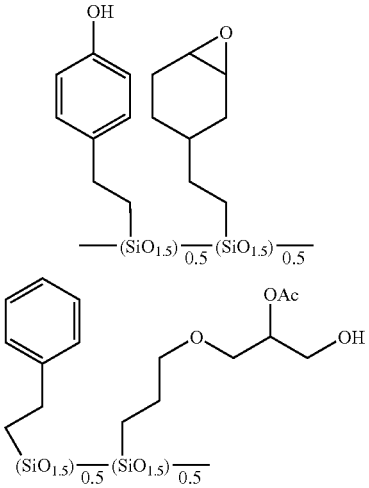

The total molecular weight of the polymer is adjusted by controlling polymerization by means well known in the art so that the polymer exhibits desired film-forming and self-segregating properties and generally comprises values in the range of about 1000 to about 100,000 g/mol, or in the range of about 1000 to about 10 000 g/mol, or the polymer components have molecular weights ranging from about 1K Daltons to about 500K Daltons.

In another aspect of the invention the bottom antireflective self-segregating material comprises a polymer comprising amidic groups to provide water solubility to the system. Such polymer can be described by the following general structure:

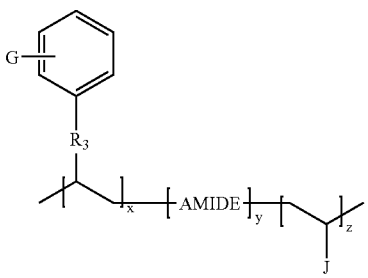

where R$_3$ comprises a linear, branched, or cyclic alkylene group of 1 to about 10 carbons, G comprises hydrogen, hydroxy-, acetoxy-, methoxy-, ethoxy- or other alkoxy- having up to about 5 carbon atoms including branched chain and straight chain alkoxy-, halogen, ester, carboxy- or a carboxamido-group, J comprises alkyl, alkoxy- where the alkyl or alkoxy-group has up to about 5 carbon atoms including branched chain and straight chain alkyl or alkoxy-, or up to about 6 carbon atom carboalkoxy or alkoxycarbonyl esters, lactone or anhydride moieties, the molar fractions x, y and z independently comprise a value from 0 to about 0.5 and the sum of x, y and z equals 1, wherein the molar fraction x controls the optical density of the antireflective polymer at 193 nm, the molar fraction y is used to control the dissolution properties of the antireflective polymer in a developer or water, and molar fraction z is used to fine tune the optical, dissolution and adhesion properties of the antireflective polymer. The amide group comprises an organic amidic group:

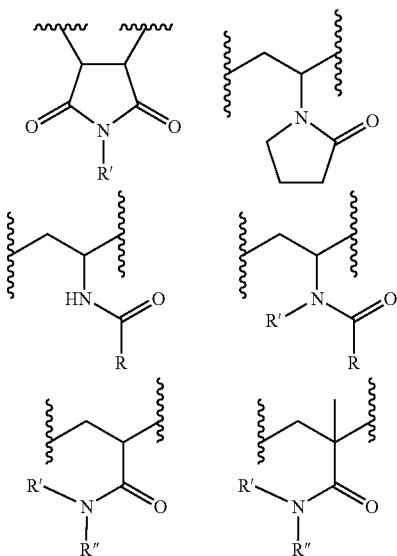

where R can be methyl, ethyl, phenyl or vinyl and R' and R" can be independently hydrogen, alkyl or aryl where the alkyl group has up to about 5 carbon atoms including branched chain and straight chain alkyl groups and the aryl group has up to about 14 ring carbon atoms.

The following examples further illustrate aspects of the invention.

EXAMPLES

Examples 1 and 2 show two embodiments of this invention for lithographic applications and illustrate the properties and advantages of the materials and formulations described.

Example 1

A formulation was prepared by dissolving 402 mg of resist polymer (50:50 copolymer of 1,1,1-trifluoro-2-trifluoromethyl-2-hydroxy-pent-4-yl methacrylate and 1-ethylcyclopentyl methacrylate), 160 mg of solution of triphenylsulfonium nonaflate (20 wt % in PGMEA), 402 mg of silsesquioxane (SSQ) polymer (60:40 copolymer of 1-(4-acetoxyphenyl)ethyl-SSQ and 1-phenylethyl-SSQ) and 883 mg of solution of N-phenylbenzimidazole (0.5 wt % in PGMEA) in 5.67 g of PGMEA. The solution was filtered through 0.2 μm syringe filter.

Example 2

The formulation of EXAMPLE 1 was spin-coated at 3000 RPM on a wafer that was previously coated with ARC-29A (Brewer Sci. 78 nm) and baked at 155° C. for 90 seconds. The wafer was then exposed using a 193 nm ministepper (NA=0.6, binary mask) using 160 nm line—and space mask pattern. The wafer was then baked at 110° C. for 60 seconds and puddle-developed in a standard 0.26 N N tetramethyl ammonium hydroxide (TMAH) developer for 30 seconds, rinsed with water, and dried. FIG. 3 illustrates the SEM cross-sections of patterns obtained.

In use, FIG. 1 illustrates a processing sequence using a self-segregating Resist/BARC imaging system according to the present invention. In FIG. 1, a formulation 100 containing multiple components and additives for the formation of a self-segregated resist/BARC multilayer as described herein is spin-cast onto a wafer 102 and baked. The vertical segregation process takes place during the coating and/or baking step, leading to the formation of a resist-BARC graded multilayer 104. Then, an optional conventional TARC layer 106 is subsequently spin-cast onto the layer 104 and baked. The stack is then exposed through mask 108 by means of DUV radiation (193 nm wavelength) 110 and post processed (baked, developed). The topcoat, TARC layer 106 is either removed by a separate process after exposure (pre resist development), or during the photoresist development step leaving developed or cross-linked layer 112 that forms a pattern 114 on top of wafer 102. Further processing typically achieved by plasma etch leaves pattern 118 in segregated layer 116. The optical constants of the self-segregated BARC layer are chosen for optimum reflectivity control. The process can be used for either conventional "dry" lithography or for immersion lithography.

FIG. 2 illustrates a processing sequence using a conventional imaging system, i.e., a conventional multilayer imaging stack comprising ARC layer 200 and a photoresist layer 204 each sequentially and separately applied on wafer 202 by a conventional deposition method (e.g., spin-coating). Then, a conventional TARC layer 206 is subsequently spin-cast onto the layer 200 and baked. Layer 200 is then exposed through mask 208 by means of DUV radiation (193 nm wavelength) 210 and post processed (baked, developed). The top coat, (TARC layer 206) is either removed by a separate process after exposure (pre resist development), or during the photoresist development step leaving developed or cross-linked layer 212 that forms a pattern 214 on top of wafer 202. Further processing typically achieved by plasma etch leaves pattern 218 in layer 216 which is a combination of layer 212 and patterned layer 200.

The process of the invention illustrated by way of FIG. 1 compared to the prior art process FIG. 2 illustrates an advantage of the invention which in this comparison shows a method of producing a device employing a four-step process as opposed the prior art process that requires a five-step process.

One aspect of the invention also relates to self-segregated resist-developable BARCs. Such developable BARCs can further reduce processing time by eliminating the need for an additional BARC-patterning step that is typical for conventional BARCs and is traditionally performed using plasma etch. This step is illustrated in FIG. 2 where the plasma etch is used to obtain patterned stack 216 from pattern resist layer 212. The pattern in the self-segregated developable BARC layer can be formed by the action of the developer as the resist image is being formed as shown in FIG. 1. The process of forming patterned stack 116 from imaged layer 104 can be accomplished by a single development step when a developable self-segregating BARC is used.

The compounds of the invention also include various organic and other moieties per se, but are also intended to include organic or other moieties that can be further substituted with substituents; where these organic and other moieties, and/or substituents comprise inter alia, aryl groups, alkyl groups; halogens, such as iodine, chlorine or bromine, alkyloxy, alkyloxo, aryloxo, alkylcarbonyloxy, carboalkoxy, aryl, aryloxy arylcarbonyloxy, or carboaryloxy group carbonyl, nitro, cyano, halogen-substituted alkyl or halogen-substituted alkyloxy (where we define halogen above), substituted alkyl, alkylene, alicyclic, hydrocarbyl, cyclic alkyl (cycloaliphatic), hetero cycloaliphatic, aralkyl or alkaryl, acyl, acyloxy, alkylenoxy, such as defined inter alia by Allen et al., U.S. Pat. No. 7,193,023, col. 3, line 51 to col. 6, line 24, and Mizutani et al. U.S. Pat. No. 7,232,640, col. 8, line 54 to col. 12, line 14, and all other moieties and substituents defined by Allen et al. (supra), and/or Mizutani et al. For the purpose of this invention, the moieties and/or substituents also include combinations of moieties and/or substituents, such as two or more of the moieties and/or substituents. Allen et al., U.S. Pat. No. 7,193,023 and Mizutani et al. U.S. Pat. No. 7,232,640 give ranges of carbon atoms that apply to the various substituents and/or moieties of this invention and the following discussion applies to these ranges as well as the combinations of moieties and/or substituents.

Throughout this specification, abstract of the disclosure, and drawings the inventors have set out equivalents, including without limitation, equivalent elements, materials, compounds, moieties, substituents, compositions, conditions, processes, structures and the like, and even though set out individually, also include combinations of these equivalents such as the two component, three component, or four component combinations, or more as well as combinations of such equivalent elements, materials, compounds, moieties, substituents, compositions conditions, processes, structures and the like in any ratios or in any manner. Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a range starting at a lower limit comprising zero or one, or a miniscule number, e.g., 0.001. The terms "about," "substantial" and "substantially" also mean that which is largely or for the most part or entirely specified. This specification also employs the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings. Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:
1. A method of forming a patterned material layer on a substrate, said method comprising:
   (a) providing a substrate;
   (b) forming a layer of a self-segregating polymeric composition on said substrate, where said self-segregating polymeric composition comprises;
      i. a polymeric photoresistive material comprising a positive working photoresist or a negative working photoresist,
      ii. a polymeric BARC material,
      iii. an optional radiation-sensitive acid generator and,
      iv. an optional base quencher,
   to form a coated substrate comprising a uniaxial bilayer polymer coating on and substantially parallel to said substrate, said uniaxial bilayer polymer coating undergoing a phase separation that is oriented in a direction orthogonal to said substrate, said coated substrate thereby including a top photoresistive coating layer and a bottom antireflective coating layer;
   (c) optionally, forming a layer comprising a top coat material on said uniaxial bilayer;
   (d) pattern-wise exposing said coated substrate to imaging radiation to form a patterned area comprising exposed areas and unexposed areas, and optionally an area not covered by a pattern;
   (e) optionally, baking the exposed substrate; and
   (f) contacting said coated substrate with a developer; wherein said antireflective coating comprises a silicon polymer having the general structure:

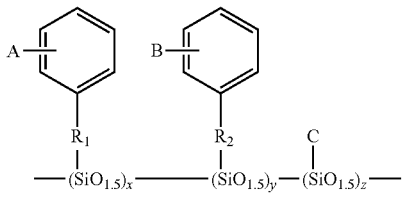

where $(SiO_{1.5})$ comprises a polysilsesquioxane polymer backbone, $R_1$ and $R_2$ independently comprise a linear, branched, or cyclic alkylene group of 1 to about 10 carbons, A is either hydrogen, methoxy-, ethoxy or other alkoxy-, halogen or an ester group, B is hydroxy-, carboxy or a carboxamido-group and is independently located in the 2-, 3- or 4-positions of the benzene ring, C is a nonaromatic moiety comprising:

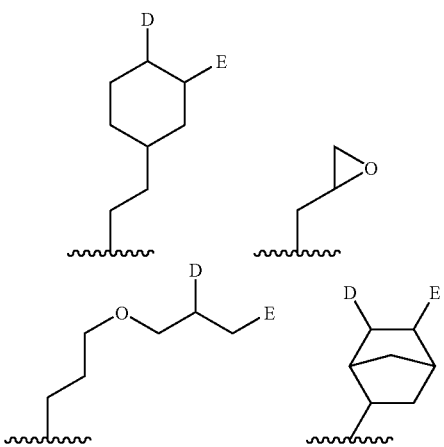

where D and E independently are hydrogen, hydroxy-, acetoxy-groups, alkylalkoxy- or alkylacetoxy-groups or D and E can form a cyclic epoxide, the molar fractions x, y and z independently represent a value from 0 to about 0.8 and the sum of x, y and z equals 1 or wherein said antireflective coating comprises an amide polymer having a general structure:

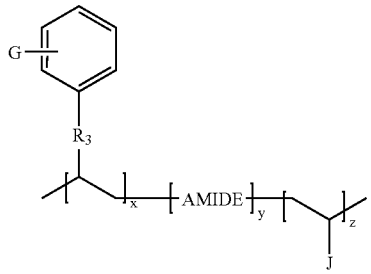

where $R_3$ is a linear, branched, or cyclic alkylene group of 1 to about 10 carbons, G is hydrogen, hydroxy-, acetoxy-, methoxy-, ethoxy- or other alkoxy-, halogen, ester, carboxy- or a carboxamido-group, J is alkyl, alkoxy-, or up to about 6 carbon atom carboalkoxy or alkoxycarbonyl esters, lactone or anhydride moieties, the molar fractions x, y and z independently are from 0 to about 0.5 and the sum of x, y and z equals 1, and the amide group is an organic amidic group:

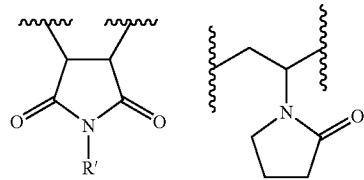

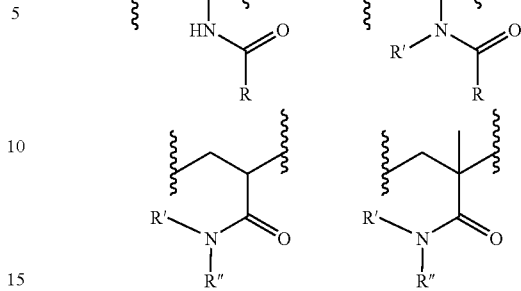

where R can be methyl, ethyl, phenyl or vinyl and R' and R" can be independently hydrogen, alkyl, or an aryl group.

2. The method of claim 1 wherein said polymeric photoresistive material comprises a positive working photoresist, said method further including forming a layer comprising a top coat material on said uniaxial bilayer, and the developer in step (f) comprises a developer selected to dissolve all of said top coat and only the exposed parts of said positive working photoresist.

3. The method of claim 1 wherein said polymeric photoresistive material comprises a positive working photoresist, said method further including forming a layer comprising a top coat material on said uniaxial bilayer, and the developer in step (f) comprises a developer selected to dissolve all of said top coat, the exposed parts of said positive working photoresist, and portions or all of said bottom antireflective coating layer in said exposed areas.

* * * * *